United States Patent [19]
Cole et al.

[11] Patent Number: 5,897,728
[45] Date of Patent: Apr. 27, 1999

[54] INTEGRATED CIRCUIT TEST STRUCTURE AND TEST PROCESS

[75] Inventors: Herbert Stanley Cole, Scotia; James Wilson Rose, Delmar; Robert John Wojnarowski, Ballston Lake; Charles William Eichelberger, Schenectady, all of N.Y.

[73] Assignee: Lockheed Martin Corporation, Bethesda, Md.

[21] Appl. No.: 07/759,691

[22] Filed: Sep. 6, 1991

Related U.S. Application Data

[63] Continuation of application No. 07/559,532, Jul. 19, 1990, abandoned, which is a continuation of application No. 07/305,314, Feb. 3, 1989, abandoned.

[51] Int. Cl.$^6$ .................................................. B32B 32/00
[52] U.S. Cl. ........................... 156/155; 156/247; 174/52.4
[58] Field of Search .................................. 156/155, 247, 156/273.3, 272.8; 174/52.4; 437/8; 324/158 F, 158 R, 158 P

[56] References Cited

U.S. PATENT DOCUMENTS

| | | | |
|---|---|---|---|
| 2,876,187 | 3/1959 | Wolinski | 156/273.3 |
| 3,515,615 | 6/1970 | Okada et al. | 156/273.3 |
| 4,059,467 | 11/1977 | Mancke et al. | 156/247 X |
| 4,714,516 | 12/1987 | Eichelberger et al. | 156/628 |
| 4,745,018 | 5/1988 | Chihara et al. | 156/629 X |
| 4,783,695 | 11/1988 | Eichelberger et al. | 357/65 |
| 4,835,704 | 5/1989 | Eichelberger et al. | 364/490 |
| 4,861,944 | 8/1989 | Jones, II et al. | 174/50.6 X |
| 4,884,122 | 11/1989 | Eichelberger et al. | 357/71 |

FOREIGN PATENT DOCUMENTS

| | | | |
|---|---|---|---|
| 0233755 | 8/1987 | European Pat. Off. | 156/272.8 |
| 2177253 | 1/1987 | United Kingdom | 437/8 |

OTHER PUBLICATIONS

C.W. Eichelberger et al., *High–Density Interconnects for Electronic Packaging*, SPIE vol. 877 Micro–Optoelectronic Materials (1988), pp. 90–91.

Bry, A., et. al. IBM Technical Disclosure Bulletin, "Reusable Chip Test Package", vol. 22, No. 4, Sep. 1979, pp. 1476–1477.

*Primary Examiner*—Jeff H. Aftergut
*Attorney, Agent, or Firm*—Geoffrey H. Krauss

[57] ABSTRACT

For fully testing and burning-in an integrated circuit chip before it is incorporated into a high density interconnect or other standard hybrid bare chip circuit, a temporary test substrate having pins extending therethrough holds the chip within a cavity. Chip pads are electrically connected with the pins to create a package that can be tested using commercially available testing and burn-in devices. After testing, the chip is retrieved from the test structure undamaged. In using HDI techniques to interconnect the chip with the pins, metal-filled vias in a polymer layer overlying the temporary test substrate electrically connect the chip to the pins through a metal interconnect pattern on the polymer layer. In another embodiment, the chip is interconnected with the pins through wire bonds. Metal-filled vias pass through an insulative coating on the chip and make electrical contact with the chip pad. A temporary buffer pad connected to a respective via and offset from the chip pad connected to that via comprises a wire-bonding site.

8 Claims, 3 Drawing Sheets

INTEGRATED CIRCUIT TEST STRUCTURE AND TEST PROCESS

This application is a Continuation of application Ser. No. 07/559,532, filed Jul. 19, 1990, now abandoned, which is a continuation of Ser. No. 07/305,314, filed Feb. 3, 1989, now abandoned.

CROSS-REFERENCE TO RELATED APPLICATIONS

This application is related to the following co-pending applications which are assigned to a common assignee and are incorporated herein by reference:

"An Adaptive Lithography System to Provide High Density Interconnect", Ser. No. 947,461, filed Dec. 29, 1986, now U.S. Pat. No. 4,835,704, issued May 30, 1989.

"Integrated Circuit Packaging Configuration for Rapid Customized Design and Unique Test Capability", Ser. No. 912,457, filed Sep. 26, 1986, now U.S. Pat. No. 4,866,508, issued Sep. 12, 1989.

"Method and Apparatus for Packaging Integrated Circuit Chips Employing a Polymer Film Overlay Layer", Ser. No. 240,367, filed Aug. 30, 1988, now U.S. Pat. No. 4,933,042, issued Jun. 12, 1990, continuation of Ser. No. 912,458, filed Sep. 26, 1986, now abandoned;

"Method and Configuration for Testing Electronic Circuits and Integrated Circuit Chips Using a Removable Overlay Layer", Ser. No. 230,654, filed Aug. 5, 1988, now U.S. Pat. No. 4,884,122, issued Nov. 28, 1989 and divisional Pat. No. 4,937,203, issued Jun. 26, 1990, continuation of application Serial No. 912,454, filed Sep. 26, 1986, now abandoned;

"High Density Interconnect with High Volumetric Efficiency", Ser. No. 250,010, filed Sep. 27, 1988;

"Method of Bonding a Thermoset Film to a Thermoplastic Material to Form a Bondable Laminate", Ser. No. 156,138, filed Feb. 16, 1988, abandoned in favor of continuation-in-part application Ser. No. 07/312,536, filed Feb. 17, 1989, now abandoned.

"Method and Apparatus for Removing Components Bonded to a Substrate", Ser. No. 249,927, filed Sep. 27, 1988, abandoned in favor of continuation application Ser. No. 07/644,716, filed Jan. 23, 1991; and "Simplified Method for Repair of High Density Interconnect", Ser. No. 283,095, filed Dec. 12, 1988, now U.S. Pat. No. 4,878,991, issued Nov. 7, 1989.

BACKGROUND OF THE INVENTION

1. Field of the Invention

This invention is related to a structure and method for fully testing integrated circuit chips before they are incorporated into high density interconnect (HDI) circuits or other standard bare chip hybrid circuits and, more particularly, to a structure and method for testing and burning-in one or more integrated circuit chips positioned in a pin grid array or other substrate structure, using conventional techniques, prior to incorporating them into the HDI or standard bare chip hybrid circuitry.

2. Description of the Prior Art

HDI circuits are comprised of a plurality of integrated circuit chips mounted on a substrate, the chips being interconnected by a metallization pattern created on a polymer overlay layer. In some HDI circuits, a multilayer interconnect pattern comprised of a plurality of polymer overlay layers is formed over the chips, each layer having its own interconnect pattern formed thereon. Typically, the interconnect pattern is formed by computer controlled laser lithography. The above-referenced co-pending patent applications describe and illustrate these circuits in great detail.

Heretofore, testing very large scale integrated circuit (VLSI) chips or other high speed chips has been performed by probing at the wafer level only to a degree sufficient to gain some assurance that the chips are not defective, or bad. The chips found not to be defective are packaged and then tested with the full test vectors at "full speed" (i.e., rated frequency). The packaged chips are burned-in by a conventional bias method, as set forth in Mil Standard 883C dated Aug. 25, 1983, at Test Method 1015.4 entitled "Burn-in Test". The bias method of burn-in has been found to be the surest way to identify weak or marginal chips.

An important feature that distinguishes HDI circuits, as well as standard hybrid circuits, from conventional circuitry is that the chips employed in the circuit are not packaged, but instead remain bare in the circuit. The chips are interconnected by a metal interconnect pattern formed on a polymer overlay layer in the HDI circuitry, while the chips are nail-head bonded in place in standard hybrid circuitry. Commercially available testing and burn-in devices cannot be used to fully test or burn-in unpackaged chips to be used in HDI circuits or other bare chip circuit designs. This is so because probing devices are limited to a relatively low megahertz (MHZ) region and have high capacitance loading. As a result, the chips are not completely tested, so that weak and marginal chips can be incorporated into an HDI circuit and hinder its functionality. This lack of adequate pretesting results in low yield and costly rework procedures.

A major difficulty in testing integrated circuit chips used in HDI circuits stems from the fact that the chips often have a large number of interconnect pads and that the interconnect pads are too small to be probed by conventional wafer probing equipment. Because the HDI chip interconnection method eliminates the chip package, the number of interconnects on a chip can be increased substantially and the size of the interconnect pads can be decreased drastically. In the past, the number and size of interconnect pads has not posed a problem because the size of the package limited those parameters to readily workable values.

SUMMARY OF THE INVENTION

It is therefore an object of this invention to provide a structure and method for fully testing and burning-in integrated circuit chips before they are incorporated into an HDI or standard hybrid circuit.

Another object of this invention is to utilize common substrate structures, such as a pin grid array or the like, as a testing structure wherein an integrated circuit chip to be tested is packaged in the testing structure, fully tested and burned-in according to conventional techniques, and then retrieved from the testing structure for incorporation into HDI or other bare chip circuitry.

Briefly, in accordance with the invention, a pin grid array or similar structure is used as a test structure for fully testing and burning-in integrated circuit chips prior to their being incorporated into an HDI circuit. Pin grid arrays are generally used as permanent packaging structures for VLSI chips and are typically made from polymeric materials, but such arrays may alternatively be made from ceramics and other suitable materials. A pin grid array is generally comprised of a polymeric or ceramic substrate having a cavity for receiving a VLSI chip and having a plurality of pins extending through the substrate and positioned around the cavity. Wires are used to electrically connect the VLSI chip to the pins. Typically, a VLSI chip that has been attached to the substrate in the cavity of a pin grid array and has been wire-bonded to the pins is covered or encapsulated, and the pins are used for electrically and mechanically connecting the VLSI chip to a circuit pattern on a printed circuit board. Nepenthe Distribution Inc. of Palo Alto, Calif. is one of several suppliers of polymeric pin grid arrays. Kyocera International, Inc., San Diego, Calif., makes many ceramic versions of pin grid arrays. It is important to note that structures similar to pin grid arrays can be made by many plastics fabricators and that the invention does not require using a pin grid array roduced by a commercial supplier of these parts, but rather, any suitable substrata having a cavity for receiving a chip and with pins extending through the substrate can be used in practicing the invention.

In one embodiment of the invention, integrated circuit chips are tested using a peelable overlay layer having a metal interconnect pattern thereon which electrically connects the chip under test to the pins. With commercially available pin grid arrays, the first step is to treat the surface of the pin grid array such that adequate adhesion can be obtained during lamination. The surface of the pin grid array is coated with a highly crosslinked epoxy solder mask material which is insoluble in organic solvents and does not adhere well to organic polymeric coatings; however, ablating the surface coating with pulses from an excimer laser creates a roughened surface to which polymeric coatings can adhere. After this surface treatment, the pin grid array is rinsed with water and blown dry.

A chip to be tested is placed in the cavity of the pin grid array or similar substrate structure using conventional pick and place machines or other standard techniques. The chip may be bonded in the cavity using, as the adhesive, Ultem® thermoplastic resin available from General Electric Company, Pittsfield, Mass. Other similar materials for die attaching are available and may be used instead of Ultem thermoplastic resin. An adhesive, preferably a thermoplastic polyimide, is spin-coated over the surface of the substrate, the chip to be tested, and the pins. A processed polymer overlay layer is then laminated over the entire structure under elevated temperature and pressure conditions. Methods of processing the polymer overlay layer and laminating the layer over a substrate and apparatus mounted thereon are disclosed in detail in the above-referenced co-pending patent applications.

Interconnecting the chip pads to the pins is accomplished using the HDI processing techniques described in the above-referenced co-pending applications. In brief, via holes are formed through the polymer overlay layer to the chip pads and to the pins, and then a metallization pattern for electrically interconnecting the chip pads to the pins is created on the polymer overlay layer by first overcoating the entire surface of the polymer overlay layer with metal to form a metallization layer wherein the metal also fills the vias and is integrally joined to the metallization layer. The metallization is next overcoated with photoresist, and an adaptive laser lithography system selectively exposes the photoresist in the pattern desired. The photoresist and unprotected metallization are thereafter removed by etching techniques, resulting in a packaged chip which has its interconnection pads electrically connected to the pins extending through the test substrate by a metallization pattern formed on a polymer overlay layer. An important advantage of this structure is that the interconnection pads on the chip can be made significantly smaller than conventional size since they are being accessed by metal-filled vias rather than by wire bonding. In addition, the chip may have many more pads than are conventionally provided since a greater number of smaller pads can be electrically connected by using the metal interconnect pattern. The chip in the pin grid array or similar substrate test structure thus created can be tested and burned-in using the same conventional methods used on standard packaged chips. A chip tester such as the LT 1000 Tektronix Automatic Test System, available from Tektronix, Inc., Beaverton, Oreg., is suitable for this purpose.

A fully tested chip is then recovered from the pin grid array by peeling off the polymer overlay layer and removing the chip from the substrate cavity. Procedures for peeling off overlay layers, cleaning adhesive from chip surfaces, removing metal deposits from chip pads, and removing a chip secured to a substrate are described in the above-referenced co-pending applications. The pin grid array or similar substrate structure may be cleaned after chip removal and used again for testing another chip. It is also possible to interconnect more than one chip in the same chip carrier. Memory chips can be mass-interconnected such that the testing and burn-in handling of individual die can be substantially reduced. Special test chips, as described in application Ser. No. 230,654, can be permanently affixed within the pin grid array or similar structure while the chips being tested would ultimately be removed and placed in the final system. In multichip configurations, the package described in application Ser. No. 912,456 can be used in lieu of a chip carrier array, i.e., no cavity is then required since chips are placed on a substrate with a frame about the center of the substrate.

In a second embodiment of the invention, the chips to be tested are specially fabricated to have temporary buffer pads positioned over their interconnect pads and in electrical communication therewith. The chips are placed in a pin grid array or similar structure to be used as a temporary package. Wires connect the temporary buffer pads to the pins such that the chips may be tested and burned-in using a conventional chip tester. The chips are prepared for testing by spraying a polyimide layer over the top surface of a semiconductor chip wafer or by laminating a polymer overlay layer over the top-surface by the methods described in application Ser. No. 240,367, forming vias through the polyimide or polymer overlay layer to the interconnect pads using the adaptive lithography system disclosed in application Ser. No. 947,461, filling the vias with metal to provide electrical connection to the associated chip pads, and sawing the wafer into chips. Offset pads extending from the metal-filled vias may be provided on the polyimide or polymer overlay layer in order to facilitate wire bonding and prevent inadvertently pulling off the chip interconnect pads when removing the wire bonds. The temporary buffer pads are comprised of the metal formed at the top of a metal-filled via and preferably include offset pads. If electro-copper is used, a slight mechanical burnishing may be necessary to achieve satisfactory bonds. Conventional wire bonding may be used to directly connect one end of the wire to a temporary buffer pad. Completion of all the wire bonding results in a packaged chip which may be tested in a conventional chip tester.

After testing and burn-in, the fully-tested chip is recovered from the pin grid array or similar structure by removing the wire bonds, stripping the polyimide from the top of the chip, and stripping the metal deposits remaining on the chip interconnect pads. If a polymer overlay layer had been laminated on the chip during fabrication, removal of the overlay layer proceeds according to a peeling procedure described in the aforementioned application Ser. No. 283,095. In brief, the chip is heated to a temperature at which the adhesive layer loses its peel strength and the polymer overlay layer is pulled off with tweezers, solvents are used to clean the adhesive from the chip surface, and the metal deposits remaining on the interconnect pads are removed in a nitric acid bath with utrasonic agitation. It is to be noted that only very small bonding pads are needed on the chip die versus the standard 4×4 mils pad. Either a 1×1 mil pad or 2×2 mils pad can be expanded upwardly to allow for wire bonding and probing, i.e., the temporary buffer pad on the polyimide surface can be 4×4 mils while the pad on the chip surface is 1×1 mil. When the polyimide and metal deposits on the chip pads are removed, the 1×1 mil pad can be readily incorporated into an HDI circuit package.

BRIEF DESCRIPTION OF THE DRAWINGS

The foregoing and other objects, aspects and advantages of the invention will be better understood from the following detailed description of the invention with reference to the drawings, in which.

DETAILED DESCRIPTION OF THE PREFERRED EMBODIMENTS OF THE INVENTION

Figure 1:
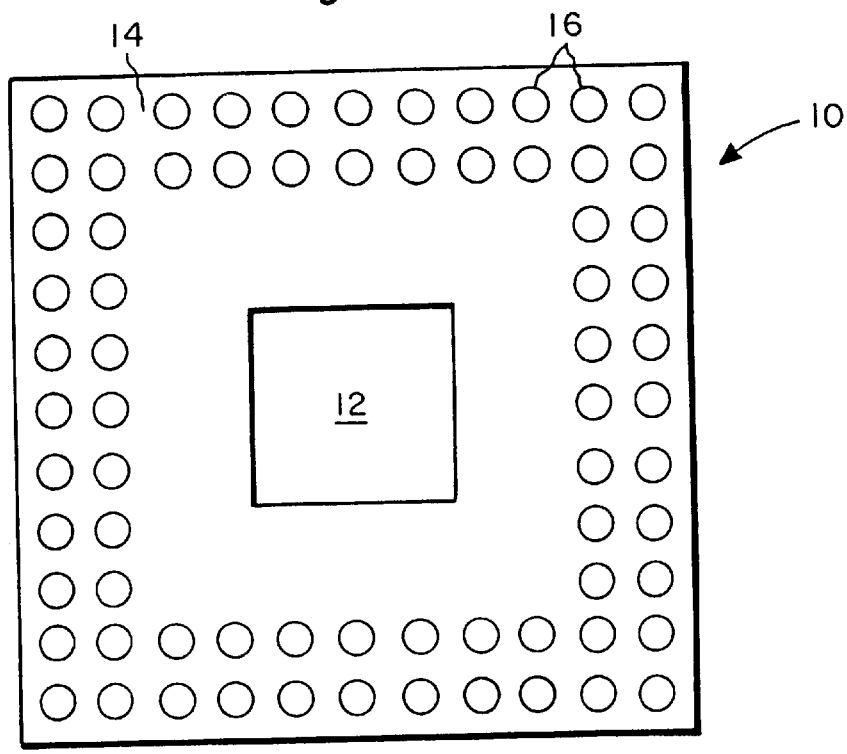
FIG. 1 is a plan view of a substrate, prior to situating an integrated circuit chip therein, which is used as a temporary test structure.

FIG. 1 shows a temporary test substrate 10 which has a cavity 12 in the center and a pin section 14 about its periphery. A plurality of pins 16 extend through the material comprising substrate 10. The temporary test substrate may be a pin grid array such as is available from several commercial suppliers including Nepenthe, Inc. or Kyocera International Inc. Pin grid arrays are comprised of polymeric or ceramic materials and are sold with the pins in place. Test substrate 10 need not, however, be a pin grid array, as will be appreciated by those skilled in the art.

Figure 2:
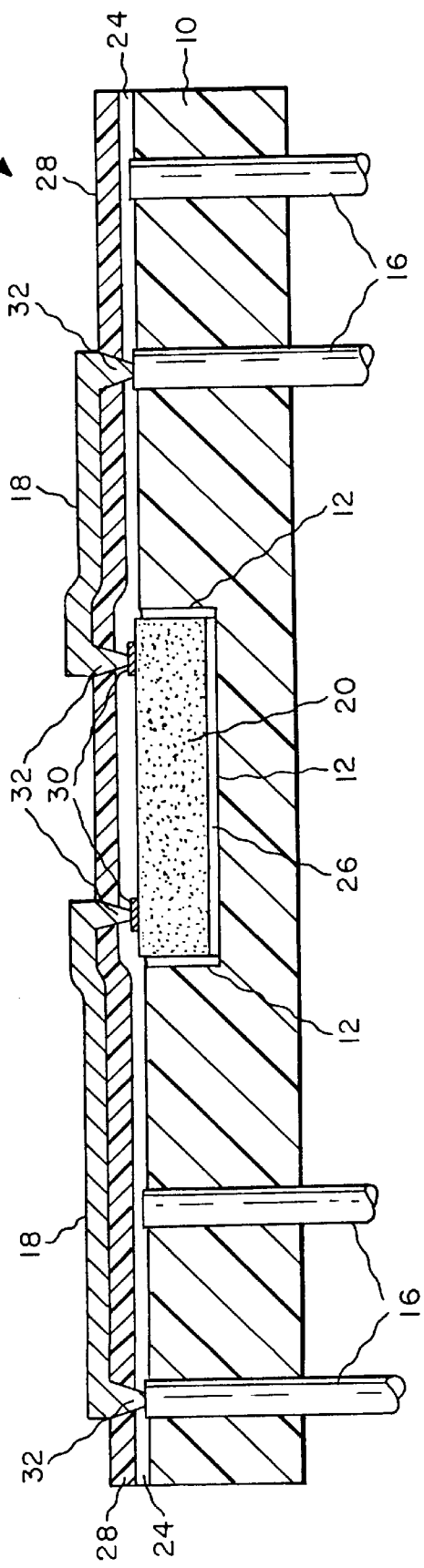
FIG. 2 is a cross-sectional side view of the temporary test structure shown in FIG. 1, showing a VLSI chip electrically connected to pins by a metal interconnect pattern formed on a polymer overlay layer.

FIG. 2 illustrates one embodiment of the invention wherein a test structure 11 comprises a metal interconnect pattern 18 electrically connecting an integrated circuit chip 20 to be tested to pins 16. If temporary test substrate 10 is a pin grid array, as shown, the top surface must be treated so that an adhesive 24 will stick to it. Commercially available pin grid arrays are typically coated with highly crosslinked epoxy solder mask materials that are insoluble in organic solvents and, because of their strong hydrophobic character, they do not adhere well to organic polymeric coatings. Laser irradiation of the solder mask material using an excimer laser operating at 248 nanometers (nm) and pulse frequency of 20 Hertz (Hz) causes either a thermal decomposition, ablation, or chemical change in the surface properties that renders the surface adherent to polymeric materials. Other laser wavelengths of operation such as 193 nm, 308 nm, and 351 nm, and different operating pulse frequencies are antici- pated to provide adequate surface treatment. In a preferred procedure a pin grid array is moved slowly under the laser beam using a computer-controlled X-Y table with the laser operating at an energy of about 100 millijoules (mJ) and a frequency of 20 Hz. Each area of surface struck by the laser beam receives only a few pulses and the total irradiation time required per pin grid array is on the order of one minute. Several pin grid arrays can be scanned during a single run. After completing surface ablation, the pin grid array is washed with water to remove any residue and blown dry with nitrogen. Laser ablation is required only to promote adhesion of a polymeric coating to a pin grid array having a solder mask layer thereon, and it is not required for temporary test substrates which are fabricated without such layer. Moreover, it has been found that the ceramic pin grid arrays available from Kyocera International Inc. do not require surface treatment.

An integrated circuit chip 20 is placed in cavity 12 using a pick and place machine, and is secured using a bonding compound 26 such as Ultem thermoplastic resin or SPI-129 polyimide siloxane, both of which are available from General Electric Company. Pins 16 pass through temporary test substrate 10 and reach approximately as high as chip interconnect pads 30 from the top surface of substrate 10. An adhesive layer 24 is applied over the top surface of temporary test substrate 10 and the top surface of integrated circuit chip 20. The requirements for adhesive 24 are: it must be adherent to both the top surface of temporary test substrate 10 and a polymer overlay layer 28, it must be laser ablatable, and it must be completely removable at the conclusion of the test. An extensive evaluation of commercially available polymers has shown that few materials meet these criteria. The General Electric siloxane polyimide, SPI-129, has been found to have the desired characteristics. SPI-129 can be easily coated on temporary test substrate 10 by spin, spray, or dip techniques. SPI-129 is a thermoplastic having a transition temperature (temperature at which the polymer begins to flow) around 120° C.–150° C. In a preferred embodiment, SPI-129 is spin-coated from solution as received from the manufacturer at 2,000 revolutions per minute (rpm). Solvent is removed by the following bake cycle: 10 minutes at 100° C. followed by 10 minutes at 150° C. Ideally, adhesive layer 24 is four micrometers thick.

Polymer overlay layer 28 is processed for lamination similar to the processing steps used in the above-referenced co-pending patent applications. In one method, Kapton® polyimide film available from E.I. duPont de Nemours and Company, Wilmington, Del., is treated by immersing it is n-methyl-2-pyrrolidone (NMP) at 75° C. for two hours. Alternatively, the method described in the aforementioned application Ser. No. 156,138 can be used. The Kapton film is swelled such that it has improved adhesion to other polymers. Two coats of adhesive 24 are applied to the side of polymer overlay layer 28 which is to be laminated to the top surface of temporary test substrate 10. The process is the same as described above, that is, spin coating followed by baking, and the final thickness is about eight micrometers. Polymer overlay layer 28 is laminated over temporary test substrate 10 by using a pressure laminator or a heated press. Lamination has been successful at a pressure of 200 pounds per square inch (psi) and a temperature of 200° C. After lamination, temporary test substrate 10 with Liaminated polymer overlay layer 28 is cooled below the transition temperature for adhesive material 24, which is 120° C.–150° C. for SPI-129, before the pressure is released.

Pins 16 and chip pads 30 are electrically interconnected using processing techniques in which a computer controlled laser lithography system selectively drills holes through polymer overlay layer 28 at points above chip pads 30 and pins 16. Particulate left behind in the hole is removed by rinsing. Chip pads 30 and pins 16 may thereafter be cleaned by reactive ion etching (RIE) to provide clean surfaces for electrical connection. A layer of metal is deposited, preferably by sputtering, over polymer overlay layer 28 to create metal vias 32 (i.e., a filling of metal in the previously-drilled holes) which are in electrical contact with chip pads 30 and pins 16. The metal layer is then patterned to create interconnect pattern 18. An important advantage in using HDI processing is that the size of chip pads 30 can be much smaller than conventional chip pads since the pads are interconnected by a metal pattern rather than by wire bonding.

Temporary test structure 11 created according to the above steps is placed in a chip testing machine, such as a Tektronix LT 1000 Automatic Test System. Integrated circuit chip 20 is tested for full functionality and burned-in under bias in the same manner as for other packaged chips. Thus a temporary package has been created which allows conventional chip testing machines to be utilized for fully testing an integrated circuit chip which is to be incorporated in the HDI or other standard hybrid bare chip circuitry. Advantageously, integrated circuit chip 20 can be retrieved from test structure 11 after testing and burn-in, and the fully tested chip can then be incorporated into the HDI circuitry. That is, after chip 20 has been tested and turned-in, it may be retrieved by peeling off polymer overlay layer 28, pulling or solvent-floating chip 20 from socket 12, cleaning off adhesive 24 with suitable solvents, and removing the metal deposits remaining on chip pads 30 by washing in a nitric acid bath. Hence, the invention makes it possible to pretest integrated circuit chips before they are incorporated into HDI circuitry.

The peeling procedure for removing polymer overlay 28 is fully disclosed in the above-referenced co-pending application Ser. No. 283,095. In performing the procedure, adhesive 24 is heated above transition temperature whereupon it loses its peel strength. Tweezers are used to grip polymer overlay layer 28 and peel it off from temporary test substrate 10. A small quantity of adhesive 24 left on chip 20 after peeling off the polymer overlay layer protects the chip from damage that may arise if polymer overlay layer 28 scrapes against the surface of chip 20. Chip 20 can be removed from the cavity by heating the bonding compound 26 holding chip 20 to substrate 10 sufficiently such that the chip can be poked out with a knife blade. If the polysulfone material known as UDEL 1700, available from Union Carbide Corp., Danbury, Conn., is used as bonding compound 26, the bonding compound can simply be dissolved with cyclohexanone. Solvents such as methylene chloride may be used to clean adhesive 24 from chip 20. Metal deposits remaining on chip pads 30, which are left behind when metal filled vias 32 are lifted off, are removed by selective etching. Chip pads 30 are typically comprised of aluminum while the metal deposits are typically a sandwich of titanium-copper-titanium. The copper can be selectively etched in a nitric acid bath. Ultrasonic agitation enhances the etching procedure. The fully tested chip retrieved from temporary-test substrate 10 is then ready to be incorporated into an HDI or other standard hybrid circuit.

Figure 3:
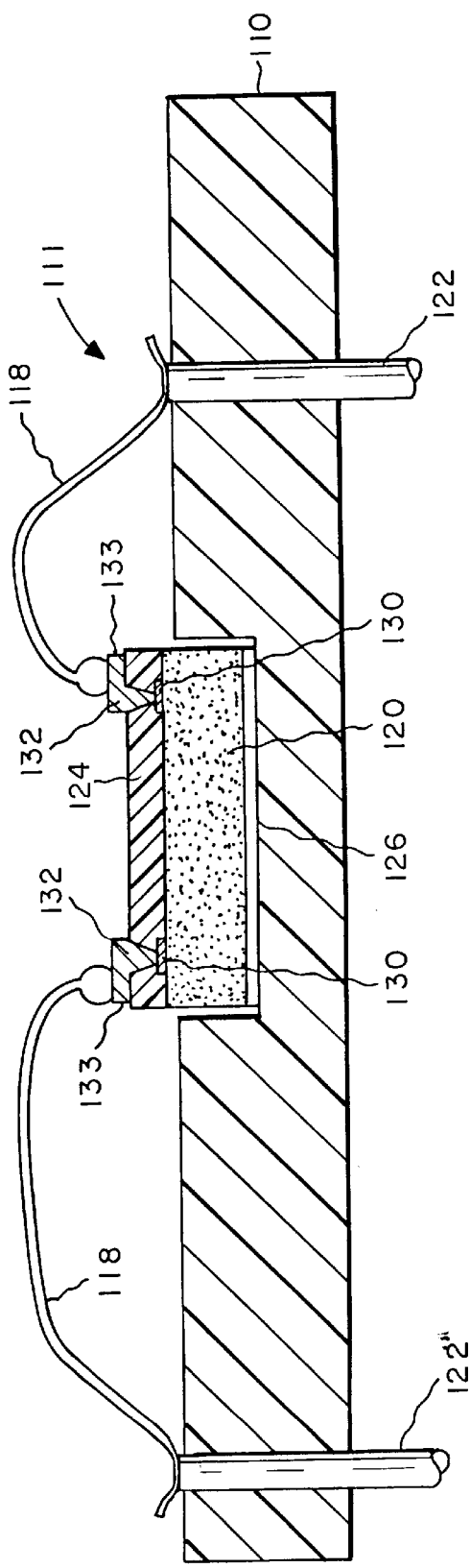
FIG. 3 is a cross-sectional side view of a VLSI chip in a temporary test structure, showing the chip being electrically connected to pins through metal wires joined to offset temporary buffer pads that are electrically connected to the chip interconnect pads through metal-filled vias extending through an insulative layer covering the top of the chip.

FIG. 3 illustrates a second embodiment of the invention wherein wire bonding is used in a temporary test structure 111. Integrated circuit chip 120 is overlaid with an insulative layer 124. Metal-filled vias 132 in insulative layer 124 are positioned above the chip interconnect pads 130 and electrically connected therewith. The uppermost portions of metal-filled vias 132 are preferably expanded to form buffer pads, such as offset pads 133 to which wires 118 (FIG. 4) are to be bonded. Offset pads 133 provide two advantages: first, it is easier to avoid damaging chip pad 130 when removing wires 118 from a buffer pad if the wire attachment is not located directly above the chip pad connected thereto and, second, the design of each buffer pad 133 can accommodate smaller chip pads 130 in that the dimensions of chip pads 130 may be 1×1 mil or 2×2 mils while each metal-filled via 132 expands upwardly such that a 4×4 mils offset pad 133 area is available for wire bonding at the insulative layer 124 surface. (Note that 4×4 mils is the standard size of an integrated circuit chip pad that is wire-bonded and that this size is a function of the sensitivity of currently available wire bonding equipment). The invention does not absolutely require an offset pad 133—all that is necessary is that a temporary buffer pad be available at the surface of the insulative layer 124 for wire bonding. In a preferred embodiment, the structure shown in FIG. 3 is fabricated by spraying an insulative layer 124, preferably polyimide, over the entire top surface of a wafer containing integrated circuit chips, laser-drilling vias through the polyimide to expose chip interconnect pads 130, filling the vias with metallization to form the buffer pads, and then sawing chips 120 from the wafer.

As shown in Figure 3, chip 120 is situated, for testing, in a temporary test substrate 110 which may be a commonly available pin grid array. Chip 120 is secured within cavity 112 using a bonding compound 126 such as Ultem thermoplastic resin or SPI-129 polyimide siloxane. By use of conventional wire bonding techniques, wires 118 are employed to electrically connect pins 122 to offset pads 133. Thus test structure 111 comprises a package and may be tested and burned-in using standard testing devices such as the LT 1000 Tektronix chip testing machine.

Chip 120 is advantageously retrievable from test structure 111. Wires 118 can simply be pulled off with the aid of tweezers. Chip 120 is then removed from cavity 112 in the same manner as described for the first embodiment, or is solvent-floated out by soaking the die bond in an appropriate solution. Adhesive 124 is dissolved by dipping the removed chip in appropriate solvent baths. Metal-filled vias 132 and associated offset pad 133 areas, which more accurately are merely metal deposits after adhesive 124 has been dissolved, are removed from chip interconnect pads 130 by placing the chip in a nitric acid bath and applying ultrasonic agitation.

In conventional pin grid array packages, the wires are bonded directly to the chip pads. The chips cannot be recovered from conventional pin grid packages because the wires cannot be removed without damaging the chip interconnect pads. An advantage of the second embodiment of the invention is that by bonding wires 118 to the temporary buffer pads (e.g., offset pads 133), chip 120 will not be damaged during recovery. The fully tested chip 120 retrieved from temporary test substrate 110 is then ready to be incorporated into an HDI or other standard hybrid circuit.

Figure 4:
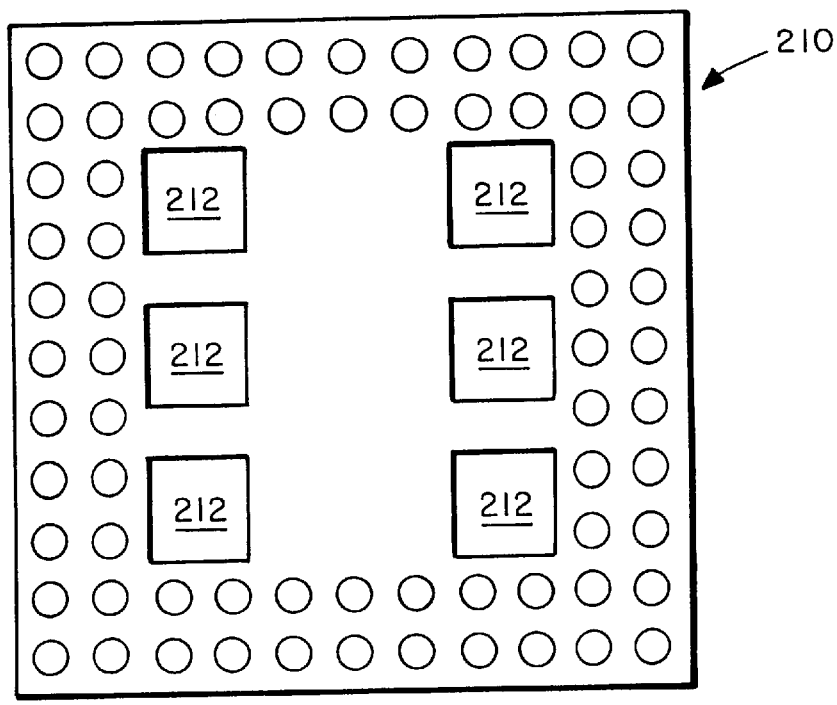
FIG. 4 is a plan view of a temporary test structure having a plurality of chip sockets.

FIG. 4 shows a temporary test substrate 210 with a plurality of cavities 212, each cavity capable of receiving a chip to be tested and subsequently incorporated into HDI or other standard hybrid circuitry. By mass-interconnecting a plurality of chips, the handling associated with testing and burn-in of several individual parts can be substantially reduced. Preferably, the HDI processing steps of the first embodiment are used for this arrangement.

Figure 5:
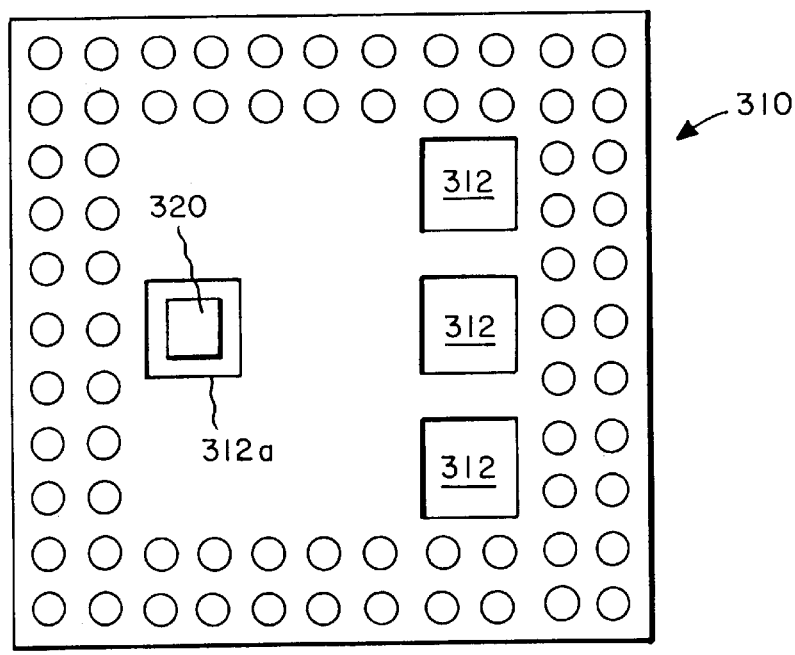
FIG. 5 is a plan view of a temporary test structure having a permanently affixed test chip.

FIG. 5 shows a temporary test substrate 310 including a plurality of cavities 312, each cavity capable of receiving a chip to be tested and ultimately incorporated into HDI or other standard hybrid circuitry. Cavity 312a is illustrated as containing a test chip 320 which is permanently affixed therein. Situating test chips in an HDI circuit to exercise a system is discussed more fully in the above-referenced co-pending application Ser. No. 230,654. After chips are fully tested and burned-in in cavities 312, they are removed from temporary test substrate 310 leaving test chip 320 behind. Preferably, the HDI processing steps of the first embodiment are utilized for this arrangement.

Figure 6:
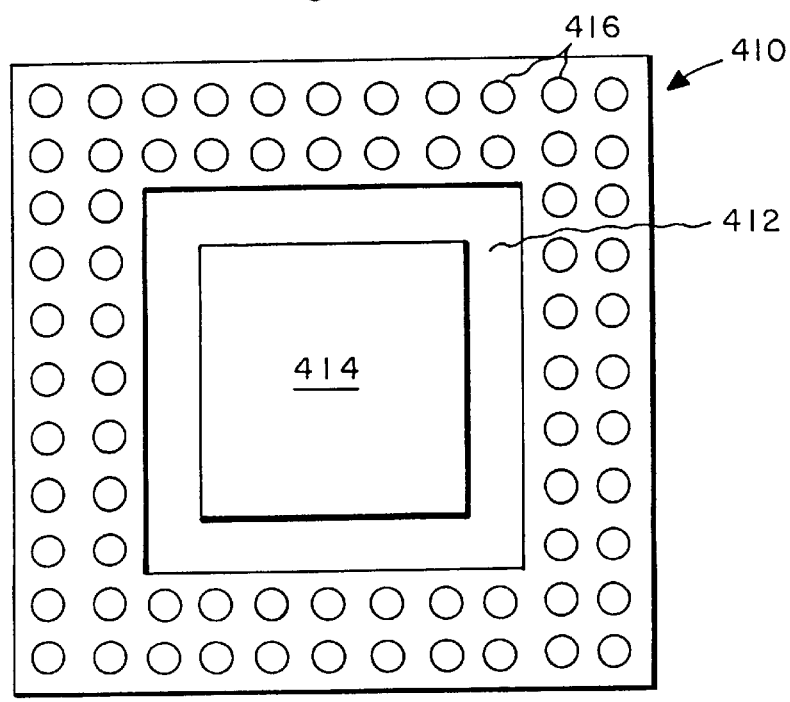
FIG. 6 is a plan view of a temporary test structure showing a frame that surrounds an area for chip placement.

FIG. 6 shows a temporary test substrate 410 with a packing insert or frame 412 defining an area 414 in which chips are to be situated. Frame 412 is similar in design to that shown in U.S. Pat. No. 4,783,695, issued Nov. 8, 1988 and assigned to the instant assignee. One or more chips are attached to temporary test substrate 410 in area 414 and the HDI processing steps of the first embodiment are used to interconnect the chip or chips with pins 416. In this design, the chips do not fit within a cavity.

While only certain preferred features of the invention have been illustrated and described herein, many modifications and changes will occur to those skilled in the art. For example, although the invention has been described in terms of the preferred embodiments where commercially available pin grid arrays are used as testing structures for integrated circuit chips which ultimately are to be included in an HDI or other standard hybrid circuit, those skilled in the art will recognize that other structures may be substituted for the pin grid array. It is, therefore, to be understood that the appended claims are intended to cover all such modifications and changes as fall within the true spirit of the invention.

What is claimed is:

1. A method for fully testing and burning-in integrated circuit chips before incorporating said chips into a high density interconnect circuit or other hybrid circuit, said chips having a plurality of chip pads thereon, said method comprising the steps of:

temporarily situating an integrated circuit chip on a test substrate with said chip pads facing away from said substrate, said test substrate having a plurality of pins extending through an entire thickness of said substrate but not in a region where said chip is situated each of said chip pads being integrally connected to a temporary buffer pad, respectively, so as to provide an electrically conductive path therebetween;

temporarily electrically connecting said chip pads with predetermined ones of said pins at locations where said predetermined pins emerge from said test substrate by providing wires to electrically connect said predetermined pins to said temporary buffer pads, each of said wires being bonded at a first end to a respective one of said predetermined pins and being bonded at a second end to a respective one of said temporary buffer pads, testing and burning-in said integrated circuit chip; and retrieving said integrated circuit chip from said test substrate for subsequent incorporation into a high density interconnect circuit or other hybrid circuit unless said chip is not fully operative.

2. The method recited in claim 1 wherein said test substrate comprises a pin grid array.

3. The method recited in claim 2 further comprising the preliminary step of laser-irradiating a surface layer of said pin grid array so as to render said surface layer adherent to an organic polymer adhesive.

4. The method recited in claim 1 wherein the step of temporarily situating said integrated circuit chip on said test substrate further comprises the step of temporarily affixing said integrated circuit chip in a cavity in said test substrate with a bonding compound.

5. The method recited in claim 4 wherein said bonding compound comprises a thermoplastic material and wherein the step of retrieving said integrated circuit chip comprises heating said thermoplastic material above its transition temperature and pulling said integrated circuit chip from said cavity.

6. The method recited in claim 4 wherein said bonding compound is readily dissolvable by appropriate solvents and wherein the step of retrieving said integrated circuit chip comprises dissolving said compound and pulling said integrated circuit chip from said cavity.

7. The method recited in claim 1 wherein each of said chip pads is smaller than 4×4 mils in area.

8. A method for fully testing and burning in integrated circuit chips before incorporating said chips into a high density interconnect circuit or other hybrid circuit, said chips having a plurality of chip pads thereon and being coated with an insulative layer, each of said chip pads being electrically connected to a temporary buffer pad, respectively, through a metal-filled via, respectively, said method comprising the steps of:

temporarily situating an integrated circuit chip on a test substrate with said chip pads facing away from said substrate, said test substrate having a plurality of pins extending through an entire thickness of said substrate but not in a region where said chip is situated;

temporarily electrically connecting said chip pads with predetermined ones of said pins at locations where said predetermined pins emerge from said test substrate by providing wires to electrically connect said predetermined pins to said temporary buffer pads, each of said wires being bonded at a first end to a respective one of said predetermined pins and being bonded at a second end to a respective one of said temporary buffer pads, each of said temporary buffer pads, respectively, being offset relative to each of said chip pads, respectively, connected thereto through a respective metal-filled via;

testing and burning-in said integrated circuit chip; and retrieving said integrated circuit chip from said test substrate for subsequent incorporation into a high density interconnect circuit or other hybrid circuit unless said chip is not fully operative.

\* \* \* \* \*